United States Patent
Catona et al.

(10) Patent No.: US 7,196,506 B2
(45) Date of Patent: Mar. 27, 2007

(54) SURFACE-MOUNTED INTEGRATED CURRENT SENSOR

(75) Inventors: Giuseppe Catona, Orbassano (IT);
Riccardo Groppo, Orbassano (IT);
Alberto Manzone, Orbassano (IT)

(73) Assignee: C.R.F. Societa Consortile per Azioni, Orbassano (IT)

( * ) Notice: Subject to any disclaimer, the term of this patent is extended or adjusted under 35 U.S.C. 154(b) by 0 days.

(21) Appl. No.: 11/354,447

(22) Filed: Feb. 14, 2006

(65) Prior Publication Data

US 2006/0181264 A1 Aug. 17, 2006

(30) Foreign Application Priority Data

Feb. 15, 2005 (EP) ................................. 05425073

(51) Int. Cl.
*G01R 15/20* (2006.01)

(52) U.S. Cl. ............................................. 324/117 H

(58) Field of Classification Search ............... None
See application file for complete search history.

(56) References Cited

U.S. PATENT DOCUMENTS 6,545,456 B1 * 4/2003 Radosevich et al. .... 324/117 H
6,683,448 B1 * 1/2004 Ohtsuka ................. 324/117 H
6,995,315 B2 * 2/2006 Sharma et al. ............... 174/529
2004/0056647 A1 3/2004 Strauth et al.

FOREIGN PATENT DOCUMENTS

EP 0 867 725 A 9/1998

OTHER PUBLICATIONS

Xiao Chucheng et al., "An Overview of Integratable Current Sensor Technologies", Conference Record of the 2003 IEEE Industry Applications Conference, 38th IAS Annual Meeting (Salt Lake City, Utah), vol. 3(3, Conf. 38), Oct. 12, 2003, p. 1251-1258.

* cited by examiner

*Primary Examiner*—Ha Tran Nguyen
*Assistant Examiner*—Trung Q. Nguyen
(74) *Attorney, Agent, or Firm*—Mitchell P. Brook; Luce, Forward, Hamilton & Scripps LLP

(57) ABSTRACT

Described herein is a surface-mounted integrated current sensor for use in a printed circuit having a track along which there flows, in use, the electric current to be measured. The current sensor comprises a package having a bottom face facing, in use, the printed circuit, and on which there is set an electrically conductive bottom piece, which, in use, makes contact with the track of the printed circuit in such a way as to be traversed by the current to be measured. The current sensor moreover comprises a sensor element, for example a Hall-effect one, designed to generate a voltage proportional to the electric current that flows through the bottom piece.

20 Claims, 2 Drawing Sheets

SURFACE-MOUNTED INTEGRATED CURRENT SENSOR

BACKGROUND OF THE INVENTION

1. Field of the Invention

The present invention relates to a surface-mounted integrated current sensor.

2. Background of the Invention

The present invention finds advantageous, but non-exclusive, application in the field of current sensors that exploit the Hall effect, to which the ensuing treatment will make explicit reference, without this implying any loss of generality.

For the measurement of currents it is known to use current sensors that exploit the Hall effect, which, as is known, is a phenomenon linked to the passage of a current through a conductor set in a region where there is present a magnetic field directed orthogonal to the direction of the current itself. In particular, the magnetic field exerts on the charge carriers a thrust orthogonal to the direction of the current (Lorentz' force) and such as to accumulate them on one edge of the conductor, thus creating an excess of charge on said edge and a consequent shortage of charge on the opposite edge. This consequently generates a difference of potential between the opposite edges of the conductor, the amount of which is proportional to the current flowing in the conductor itself. The presence of this difference of potential between the opposite edges of a conductor traversed by current and subjected to a magnetic field orthogonal thereto assumes precisely the name of Hall effect.

In the current sensors referred to above, this effect is exploited by causing the current to be measured to flow along a conductive path, so as to generate a magnetic field proportional thereto, within which there is set a further conductive path, orthogonal to the magnetic field itself, along which a test current is made to flow and the difference of potential existing between the opposite edges of the second conductive path itself is measured.

FIGS. 1a, 1b, 1c and 1d illustrate four different types of known integrated current sensors that exploit the Hall effect, i.e., that are provided with a Hall-effect transducer designed to sense the magnetic field generated by the passage of the current and to convert it into a voltage proportional thereto via a purposely provided sensing and conditioning electronics. In particular, FIG. 1a illustrates a current sensor in which the current to be measured flows along a conductive path that does not form part of the current sensor itself and that traverses a through opening made in the package of the current sensor, whilst FIGS. 1b, 1c and 1d illustrate three current sensors, in which the current to be measured flows along a conductive path that forms part of the current sensor and develops within the package of the current sensor along a conductive path forming part of the current sensor itself. In particular, the current sensors illustrated in FIGS. 1a and 1b comprise a magnetic core, in the air gap of which is set the Hall-effect transducer and in which the flow of the magnetic field generated by the current to be measured is concentrated.

The currents that can be measured by the current sensors illustrated in FIGS. 1a–1d can vary from a few amps to some hundreds of amps, according to the cross section of the conductors through which the current to be measured flows.

Albeit widely used, these current sensors are affected by certain limitations that do not enable an adequate exploitation of all their advantages. In particular, the main limitations of the current sensors illustrated in FIGS. 1a and 1b are represented by the overall dimensions and by their difficulty of integration within printed circuits, this being due to the fact that they are far from adequate for a surface mounting on a printed circuit and to the fact that, since they project markedly from the printed circuit in a vertical direction, they limit the degree of stacking of the printed circuits.

The main limitations of the current sensor illustrated in FIG. 1c are, instead, represented by the fact that it is far from adequate for a surface mounting on a printed circuit and by the overall dimensions, the latter being due to the presence of terminals dedicated to the measurement of the current, which have dimensions significantly greater than those of the traditional pins of integrated circuits, and, above all, project laterally from the package in a somewhat obtrusive way.

Finally, the main limitation of the current sensor illustrated in FIG. 1d is represented by the fact that the current to be measured is introduced into the current sensor through pins having the same dimensions as traditional ones, the reduced dimensions of which sensibly limit the maximum current measurable by the current sensor.

BRIEF SUMMARY OF THE INVENTION

The purpose of the present invention is therefore to provide an integrated current sensor which will be free from the limitations of known current sensors, and in particular will enable measurement of high currents, will be suitable for surface mounting on a printed circuit, will present small dimensions and a high precision of positioning of the Hall-effect transducer with respect to the path through which the current to be measured flows.

The above purpose is achieved by the present invention in so far as it relates to an integrated current sensor as defined in claim 1.

BRIEF SUMMARY OF THE DRAWINGS

For a better understanding of the present invention, there is now described a preferred embodiment, purely by way of non-limiting example, with reference to the attached plate of drawings, in which.

DETAILED DESCRIPTION OF THE INVENTION

Figure 1A:
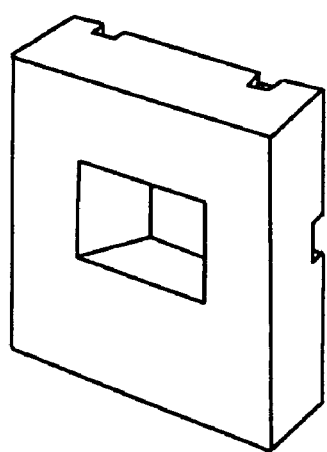
FIGS. 1a, 1b, 1c and 1d are perspective views of current sensors according to the known art.
Figure 1B:
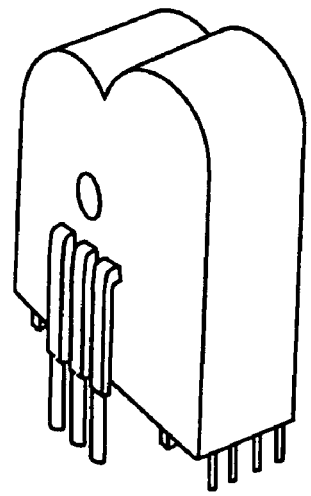
Figure 1C:
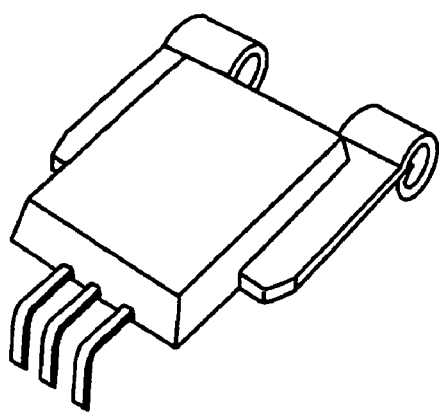
Figure 1D:
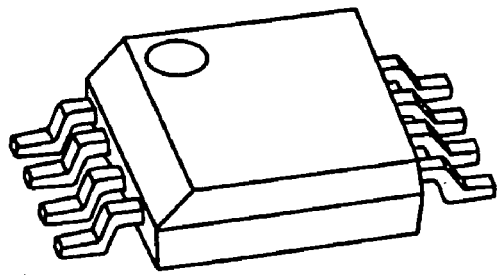
Figure 2A:
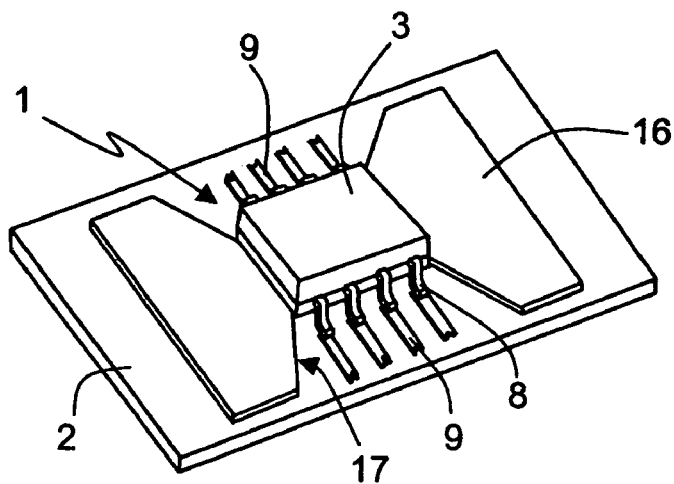
FIGS. 2a, 2b and 2c are a perspective view, a cross-sectional side view, and a view from beneath, respectively, of a surface-mounted integrated current sensor according to the present invention.
Figure 2B:
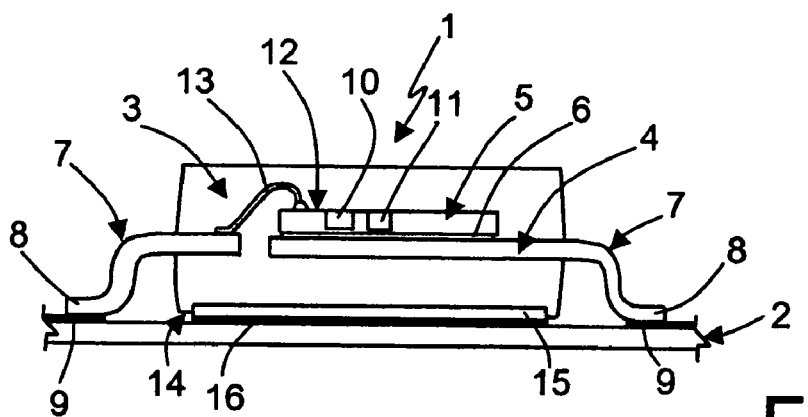
Figure 2C:
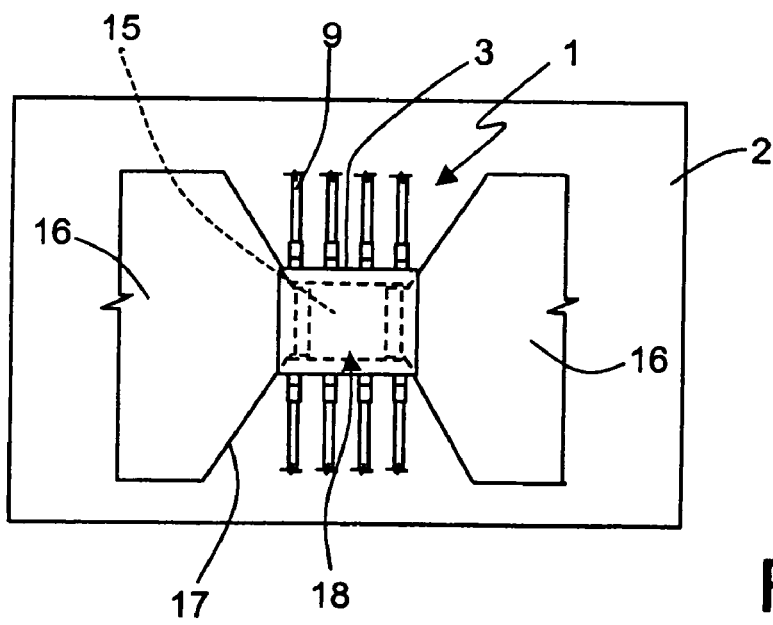

Illustrated and designated as a whole by the reference number 1 in FIGS. 2a, 2b and 2c is an integrated current sensor according to the present invention, which is particularly suitable for surface mounting on a printed circuit 2.

The current sensor 1 comprises a package 3, typically made of epoxy resin, of a generally parallelepipedal shape, which houses inside it a leadframe 4, and a chip 5 made of semiconductor material fixed to the leadframe 4, typically via a bonding layer 6. In particular, the supporting structure 4 is provided with leads 7, the terminal stretches of which come out of the package 3 and define external pins 8 designed to be connected, in use, to respective conductive tracks 9 of the printed circuit 2, typically via bonding, whilst the chip 5 integrates within it a Hall-effect transducer 10 and the corresponding electronics 11 for signal measurement and conditioning, which are connected to contact pads 12, which are in turn connected to respective leads 7 via bonding wires 13, typically made of gold.

According to the present invention, on the bottom face 14 of the package 3, i.e., the one facing in use (that is, when the current sensor 1 is mounted on the printed circuit 2) the printed circuit 2 itself, there is set an electrically conductive bottom piece 15 constituted by a metal plate having a substantially rectangular shape, which projects from the bottom face 14 of the package 3 and has: an external face set flush with the pins 9 and shaped in such a way as to bridge, when the current sensor 1 is mounted on the printed circuit 2, an electrically conductive track 16 of the printed circuit 1, along which there flows, in use, the current to be measured; and an internal face facing the Hall-effect transducer 10, which is made in the chip 5 in a position as adjacent as possible to the bottom piece 15.

In particular, the bottom piece 15 is contained completely in the maximum overall dimensions of the package 3 as these are projected on the printed circuit 2, and in particular is contained completely within the perimeter of the bottom face of the package 3, and occupies the most part thereof.

The width and the length of the bottom piece 15 are constrained by the dimensions of the package 3, whilst the thickness is chosen in such a way as to withstand the current to be measured that flows along the track 16.

Conveniently, but not necessarily, a package 3 of the type commercially known as Power SO-8 can be used, which, unlike the standard SO-8, is equipped with a metal bottom piece provided for purposes of heat dissipation.

To get an idea of the dimensions of the bottom piece 15, consider for example that to measure a current of 60 A, the track 16 must have a nominal width of approximately 3 cm, whilst in a Power SO-8 package the bottom piece has a width of approximately 0.3 cm and a length of approximately 0.4 cm.

In the example illustrated in FIGS. 2*a* and 2*c*, the track 16 has a nominal width greater than that of the current sensor 1 so as to enable passage of high currents, even ones of the order of hundreds of amps, and has a restriction 17, which has a width substantially equal to that of the bottom piece 15 and in a position corresponding to which there is provided an interruption 18 having a length smaller than that of the bottom piece 15 itself.

The current sensor 1 is mounted on the printed circuit 2 in a position corresponding to the restriction 17 of the track 16, by bonding the pins 7 on the tracks 9 and the bottom piece 15 on the track 16. In this way, the bottom piece 15 bridges electrically the ends of the two stretches of the track 16, which are thus electrically separated by the interruption 18.

Operation of the current sensor 1 is described in what follows.

The current to be measured that flows along the track 16 traverses the bottom piece 15, thus generating a magnetic field proportional thereto, which is sensed by the Hall-effect transducer 10 and converted into a voltage proportional thereto via the electronics of signal measurement and conditioning 11. The voltage thus generated is then supplied on one or more pins 9 of the current sensor 1 provided for this purpose.

As compared to current sensors according to the known art, the current sensor 1 according to the present invention presents the following advantages:

- precise positioning of the Hall-effect transducer with respect to the path through which the current to be measured flows, with evident benefits in terms of precision of measurement;
- insensitivity of current measurement to external disturbance of any type: electromagnetic, mechanical, etc.;
- compactness of the current sensor in relation to the current to be measured: in fact, by appropriately sizing the bottom piece it is possible to measure considerably high currents;
- small dimensions of the current sensor: the bottom piece is in fact completely contained in the overall dimensions of the package, so that it does not project laterally therefrom;
- simplification in the construction of the printed circuit;
- the fact that even though the restriction made along the track of the printed circuit along which the current to be measured flows, in a position corresponding to which there is then mounted the current sensor, involves a slight local increase in the electrical resistance of the track, said restriction does not cause any important local increase in temperature in so far as the wide part of the track functions as dissipater of heat, both the heat produced by the restriction of the track itself and that generated by the passage of the current to be measured through the bottom piece of the current sensor.

Finally, it is clear that modifications and variations can be made to the current sensor described and illustrated herein, without thereby departing from the sphere of protection of the present invention, as defined in the annexed claims.

In particular, the measurement of current could be made in a way different from the one described above, i.e., without exploiting the Hall effect. For example, the measurement of current could be made by measuring the voltage across a shunt connected to the bottom piece, which is proportional to the current flowing in the bottom piece itself. Alternatively, the measurement of current could be made by measuring directly the voltage across the bottom piece itself.

Furthermore, the bottom piece could assume a shape different from the rectangular one illustrated in FIGS. 2*a*–2*c*, or else the bottom piece could be replaced with different conductive elements, for example a series of parallel rectilinear tracks set at a distance apart from one another, or else tracks having a different pattern, e.g., a zigzag pattern.

Finally, the implementation of the present invention does not mean that the track of the printed circuit along which the current to be measured flows must present an interruption. In fact, the current sensor could be mounted in a position corresponding to a continuous restriction, i.e., without interruptions, so that the bottom piece would be connected in parallel to a stretch of the restriction of equal length.

The invention claimed is:

1. A surface-mounted integrated current sensor for use in a printed circuit, said printed circuit comprising at least one electrically conductive track, along which there flows, in use, an electric current to be measured, said current sensor comprising:

a package having a face facing, in use, said printed circuit;
   a current path through which there flows, in use, said electric current to be measured; and
   sensor means configured for generating an electrical quantity correlated to said electric current flowing along said current path;
   said current sensor being characterized in that said current path comprises electrically conductive means, which are set on said face of said package and are configured for contacting, in use, said track of said printed circuit.

2. The current sensor according to claim 1, in which said electrically conductive means are contained completely in the maximum overall dimensions of said package on said printed circuit.

3. The current sensor according to claim 1, in which said electrically conductive means are contained completely within the perimeter of said face.

4. The current sensor according to claim 1, in which said electrically conductive means comprise a plate.

5. The current sensor according to claim 4, in which said plate is a metal plate.

6. The current sensor according to claim 4, in which said plate is sized according to said electric current to be measured.

7. The current sensor according to claim 1, in which said sensor means are of a Hall-effect type.

8. The current sensor according to claim 1, in which said sensor means comprise a shunt.

9. A printed circuit comprising at least one electrically conductive track, along which there flows, in use, an electric current to be measured, said printed circuit being characterized in that it moreover comprises a surface-mounted integrated current sensor according to claim 1.

10. The printed circuit according to claim 9, in which said track has a restriction, in a position corresponding to which said current sensor is mounted.

11. The printed circuit according to claim 10, in which said restriction has an interruption, and in which said electrically conductive means electrically bridge the ends of the two stretches of said track separated by said interruption.

12. A surface-mounted integrated current sensor for use in a printed circuit, said current sensor comprising:
   a package having a face configured to be disposed in a facing relationship with the printed circuit;
   a conductor extending across the face, wherein the conductor is configured to provide a path for a current to be measured; and
   a current measuring member disposed within the package, wherein the current measuring member is configured for generating an electrical quantity correlating to the electric current flowing through the conductor.

13. The current sensor according to claim 12, wherein the conductor is disposed over a majority of the surface area of the face.

14. The current sensor according to claim 12, wherein the current measuring member includes at least one lead extending outward from the package through a lateral side of the package.

15. The current sensor according to claim 12, wherein the conductor extends beyond the perimeter of the package from the face.

16. The current sensor according to claim 12, wherein the conductor has a width that is approximately equal to the width of the package.

17. The current sensor according to claim 16, wherein the conductor has a length that is approximately equal to the length of the package.

18. A printed circuit, comprising:
   at least one electrically conductive track configured to provide a path for an electric current to be measured; and
   a current sensor, comprising:
   a package;
   a conductor extending across a face of the package, wherein the conductor is electrically coupled to the conductive track; and
   a current measuring member disposed within the package, wherein the current measuring member is configured for generating an electrical quantity correlating to the electric current flowing through the conductor.

19. The printed circuit according to claim 18, wherein the conductive track is discontinuous and defines a gap and the conductor is physically coupled to the conductive track such that it bridges the gap.

20. The printed circuit according to claim 19, wherein the conductor has a width that is approximately equal to the width of the package.

* * * * *